(12) United States Patent
Ishiwata et al.

(10) Patent No.: US 10,206,274 B2
(45) Date of Patent: Feb. 12, 2019

(54) PRINTED CIRCUIT BOARD

(71) Applicant: MURATA MANUFACTURING CO., LTD., Kyoto-fu (JP)

(72) Inventors: Yu Ishiwata, Nagaokakyo (JP); Takahiro Azuma, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/229,370

(22) Filed: Aug. 5, 2016

(65) Prior Publication Data

US 2016/0345429 A1 Nov. 24, 2016

Related U.S. Application Data

(63) Continuation of application No. PCT/JP2015/050041, filed on Jan. 5, 2015.

(30) Foreign Application Priority Data

Feb. 12, 2014 (JP) .................................. 2014-024130

(51) Int. Cl.
*H05K 1/02* (2006.01)
*H01Q 1/52* (2006.01)
(Continued)

(52) U.S. Cl.
CPC .......... *H05K 1/0233* (2013.01); *H01Q 1/526* (2013.01); *H01Q 9/0407* (2013.01); *H01Q 9/0421* (2013.01); *H01Q 9/0457* (2013.01); *H01Q 23/00* (2013.01); *H05K 1/0218* (2013.01); *H05K 1/0225* (2013.01); *H05K 1/0237* (2013.01);
(Continued)

(58) Field of Classification Search
CPC .............. H05K 1/0218; H05K 1/0233; H05K 2201/09536; H05K 2201/09236; H05K 2201/09618; H05K 2201/10098; H05K 1/0225; H05K 1/0237; H05K 1/162;
(Continued)

(56) References Cited

U.S. PATENT DOCUMENTS 5,926,377 A * 7/1999 Nakao .................. H05K 1/0227
174/255
6,483,481 B1 11/2002 Sievenpiper et al.
(Continued)

FOREIGN PATENT DOCUMENTS

| JP | 2001211047 A | 8/2001 |
|----|--------------|--------|
| JP | 2009105575 A | 5/2009 |

(Continued)

OTHER PUBLICATIONS

International Search Report issued in corresponding PCT/JP2015/050041 dated Mar. 31, 2015, 4pp.
(Continued)

*Primary Examiner* — Steven T Sawyer
(74) *Attorney, Agent, or Firm* — Studebaker & Brackett PC

(57) ABSTRACT

A ground conductor film is formed at an insulating substrate. A floating conductor film capacitively couples to the ground conductor film. A radiating element is connected to the floating conductor film. A shielding film shields an electromagnetic wave radiated from the radiating element. By applying such a configuration to a printed circuit board, noise reduction can be achieved.

4 Claims, 5 Drawing Sheets

(51) Int. Cl.
   *H01Q 9/04* (2006.01)
   *H01Q 23/00* (2006.01)
   *H05K 1/16* (2006.01)

(52) U.S. Cl.
   CPC ..... *H05K 1/162* (2013.01); *H05K 2201/0715* (2013.01); *H05K 2201/09236* (2013.01); *H05K 2201/09618* (2013.01); *H05K 2201/10098* (2013.01)

(58) Field of Classification Search
   CPC ........... H05K 2201/0715; H01Q 1/526; H01Q 9/0407; H01Q 9/0421; H01Q 9/0457; H01Q 23/00
   See application file for complete search history.

(56) References Cited

U.S. PATENT DOCUMENTS

| | | | | |
|---|---|---|---|---|
| 6,614,325 | B1* | 9/2003 | Kocin | H01P 5/12 174/251 |
| 6,625,040 | B1* | 9/2003 | Tuttle | G11C 5/04 174/255 |
| 2003/0063427 | A1* | 4/2003 | Kunihiro | H01F 17/0006 361/277 |
| 2008/0073796 | A1* | 3/2008 | Harvey | H01L 23/49827 257/774 |
| 2008/0093112 | A1* | 4/2008 | Kushta | H01P 1/2039 174/260 |
| 2011/0134010 | A1 | 6/2011 | Toyao et al. | |
| 2011/0147068 | A1* | 6/2011 | Cahill | G06F 17/5077 174/266 |
| 2012/0274423 | A1 | 11/2012 | Kato | |
| 2014/0077896 | A1* | 3/2014 | Lee | H03H 7/17 333/185 |
| 2014/0083756 | A1* | 3/2014 | Moeller | H05K 1/0231 174/260 |

FOREIGN PATENT DOCUMENTS

| | | |
|---|---|---|
| JP | 5522042 B2 | 6/2014 |
| WO | 2010013496 A1 | 2/2010 |

OTHER PUBLICATIONS

Written Opinion issued in corresponding PCT/JP2015/050041 dated Mar. 31, 2015, 3pp.

\* cited by examiner

PRINTED CIRCUIT BOARD

CROSS REFERENCE TO RELATED APPLICATIONS

This application claims benefit of priority to Japanese Patent Application 2014-024130 filed Feb. 12, 2014, and to International Patent Application No. PCT/JP2015/050041 filed Jan. 5, 2015, the entire content of which is incorporated herein by reference.

TECHNICAL FIELD

The present disclosure relates to a printed circuit board which can reduce noise generated within the printed circuit board.

BACKGROUND

A filter which prevents a high frequency noise current from propagating to a cable via a connector is disclosed in Japanese Patent Laying-Open No. 2009-105575. In the filter disclosed in Japanese Patent Laying-Open No. 2009-105575, a region which exhibits high impedance is formed at a portion around a connector of the printed circuit board. The region which exhibits high impedance has an electromagnetic band gap structure having a band gap which prevents propagation of electromagnetic waves at a prescribed frequency band. A surface structure which exhibits high impedance at a plurality of frequency bands is disclosed in U.S. Pat. No. 6,483,481.

The region which exhibits high impedance includes a plurality of conductor pieces disposed at a first conductor layer periodically, a ground conductor film disposed at a second conductor layer, and a conductor pillar which connects the plurality of conductor pieces to the ground conductor film.

SUMMARY

Technical Problem

The above described conventional technology can suppress a common mode current which flows to a ground of a connector connected to a printed circuit board. However, it is difficult to suppress propagation of noise generated in some circuit on the printed circuit board to another circuit on the same printed circuit board. Accordingly, the noise easily spreads throughout the entire printed circuit board. The noise spread in the printed circuit board may result in secondary radiation.

An object of the present disclosure is to provide a printed circuit board which can reduce noise.

Solution to Problem

According to one aspect of the present disclosure, there is provided a printed circuit board comprising:
a ground conductor film formed at an insulating substrate;
a floating conductor film capacitively coupling to the ground conductor film;
a radiating element connected to the floating conductor film; and
a shielding film shielding an electromagnetic wave radiated from the radiating element.

Noise caused at the ground conductor film propagates to the floating conductor film and is radiated as an electromagnetic wave from the radiating element. The radiated electromagnetic wave is shielded by the shielding film. The noise caused at the ground conductor film can be radiated as electromagnetic energy and consumed to reduce noise.

The floating conductor film may be disposed at the same conductor layer as the ground conductor film. The radiating element may be disposed at a conductor layer different from the floating conductor film. The shielding film may be disposed such that it is spaced from the conductor pattern in a direction of a thickness. The shielding film may be formed of a conductive material and connected to the ground conductor film. The shielding film may be formed of a magnetic material.

Advantageous Effects of Disclosure

Noise caused at a ground conductor film propagates to a floating conductor film and is radiated as an electromagnetic wave from a radiating element. The radiated electromagnetic wave is shielded by a shielding film. The noise caused at the ground conductor film can be radiated as electromagnetic energy and consumed to reduce noise.

DETAILED DESCRIPTION

Embodiment 1

Figure 1A:
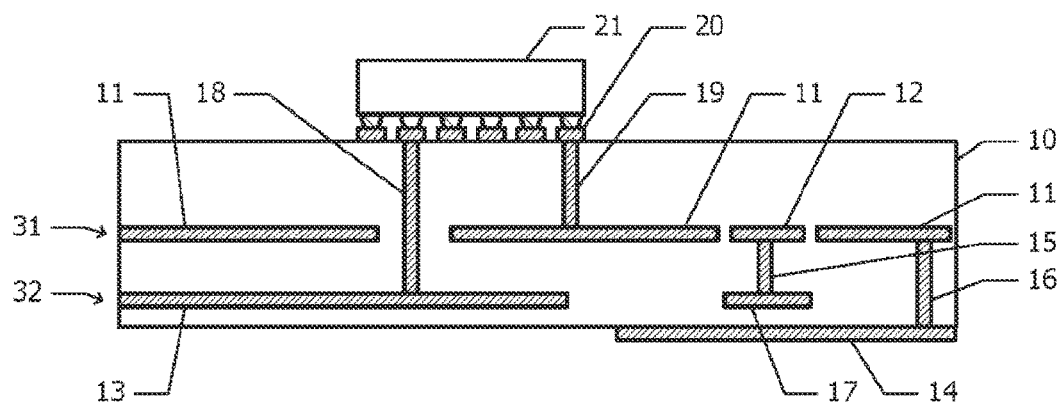
FIG. 1A is a cross section of a printed circuit board according to Embodiment 1.

FIG. 1A is a cross section of a printed circuit board according to Embodiment 1. The printed circuit board according to Embodiment 1 can be produced for example by a build-up construction method.

In an insulating substrate 10, a plurality of conductor layers, e.g., a first conductor layer 31, a second conductor layer 32 and the like are disposed. First conductor layer 31 includes a ground conductor film 11 and a floating conductor film 12. Floating conductor film 12 capacitively couples to ground conductor film 11. Second conductor layer 32 includes a power supply conductor film 13 and a radiating element 17. Ground potential is applied to ground conductor film 11, and power supply voltage is applied to power supply conductor film 13. Radiating element 17 is connected to floating conductor film 12 by an interlayer connection member 15.

A shielding film 14 is disposed such that it is spaced from radiating element 17 in the direction of the thickness of insulating substrate 10. In the example shown in FIG. 1A, shielding film 14 is formed on a back surface of insulating substrate 10 opposite to a device mounting surface of insulating substrate 10. Shielding film 14 may be included in a conductor layer internal to insulating substrate 10. Shielding film 14 is formed of a conductive material such as copper and connected to ground conductor film 11 by an interlayer connection member 16.

An integrated circuit device 21 is mounted on the device mounting surface of insulating substrate 10. Integrated circuit device 21 is connected to a plurality of pads 20 disposed on the device mounting surface. Some pads 20 are connected to power supply conductor film 13 by an interlayer connection member 18, and some other pads 20 are connected to ground conductor film 11 by an interlayer connection member 19.

Figure 1B:
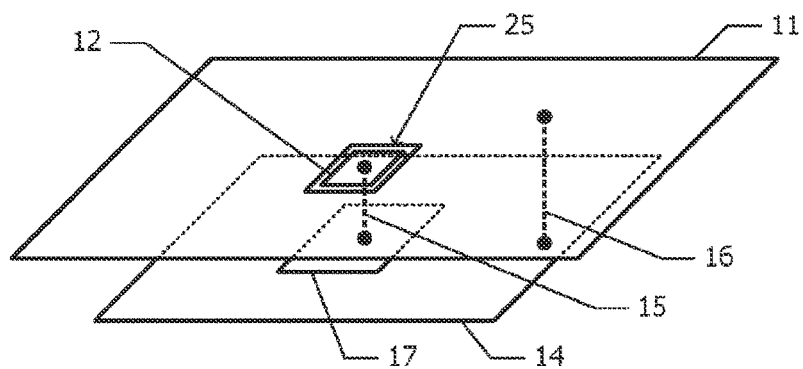
FIG. 1B is a perspective view of a ground conductor film, a floating conductor film, a radiating element, and a shielding film.

FIG. 1B is a perspective view of ground conductor film 11, floating conductor film 12, radiating element 17, and shielding film 14. An opening 25 is formed in ground conductor film 11. In this opening 25, floating conductor film 12 is disposed away from an edge of opening 25. Floating conductor film 12 and radiating element 17 are connected to each other by interlayer connection member 15. Shielding film 14 is connected to ground conductor film 11 by interlayer connection member 16. Radiating element 17 is configured by a conductor pattern which has a planar shape for example such as a square, a rectangle or the like, and operates as a patch antenna.

Figure 2:
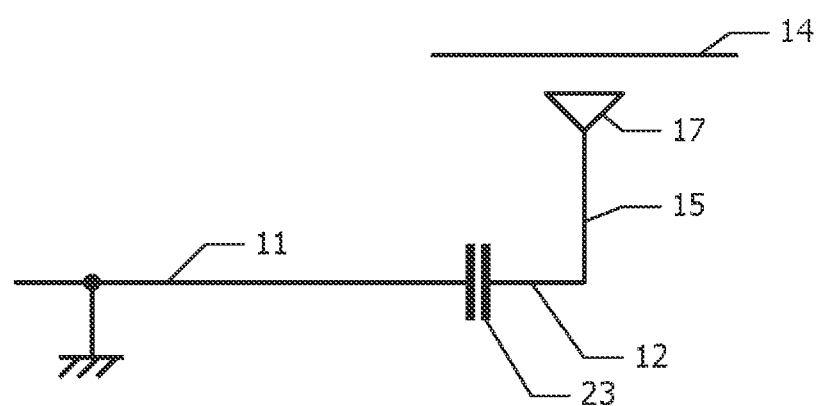
FIG. 2 is an equivalent circuit diagram of the ground conductor film, the floating conductor film, the radiating element, and the shielding film.

FIG. 2 is an equivalent circuit diagram of ground conductor film 11, floating conductor film 12, radiating element 17, and shielding film 14. Ground conductor film 11 is connected to floating conductor film 12 via a capacitor 23. Capacitor 23 is based on an electrostatic capacity caused as a result of a gap between the edge of opening 25 in ground conductor film 11 shown in FIG. 1B and floating conductor film 12.

A noise current generated in ground conductor film 11 flows to radiating element 17 via capacitor 23, and an electromagnetic wave is radiated from radiating element 17. The electromagnetic wave radiated from radiating element 17 is shielded by shielding film 14. Thus, the noise current generated in ground conductor film 11 is converted into electromagnetic energy by radiating element 17. Radiating element 17 radiates electromagnetic energy, which is prevented by shielding film 14 from being externally radiated, and is eventually consumed within the printed circuit board. As a result, reduction in noise level is achieved as observed throughout the entire printed circuit board.

Generally, reduction in noise level can be achieved by feeding back electromagnetic noise to ground conductor film 11. However, when ground conductor film 11 is unstable in potential, the noise fed back to ground conductor film 11 may have an adverse effect on a variety of circuits mounted on the printed circuit board. In order to take an effective anti-noise approach, it is effective to dissipate noise energy itself. In the above described Embodiment 1, noise energy is radiated as electromagnetic energy, and accordingly, even when ground conductor film 11 is unstable in potential, reduction in noise level can be achieved. For example, when the printed circuit board according to Embodiment 1 is used as a printed circuit board of a personal digital assistant, a significant noise reduction effect is obtained.

It is preferable that the electrostatic capacity of capacitor 23 and the shape and dimension of radiating element 17 be determined to be able to efficiently radiate an electromagnetic wave of a frequency band of noise to be removed. For example, the electrostatic capacity of capacitor 23 and the shape and dimension of radiating element 17 are determined so that an electromagnetic wave corresponding to an operating frequency of integrated circuit device 21 mounted on the printed circuit board can be efficiently radiated. This allows an enhanced noise removal effect.

Embodiment 2

Then, with reference to FIG. 3A and FIG. 3B, a printed circuit board according to Embodiment 2 will now be described. Hereinafter, a difference from Embodiment 1 shown in FIG. 1A to FIG. 2 will be focused on and thus described, and the identical configuration will not be described.

Figure 3A:
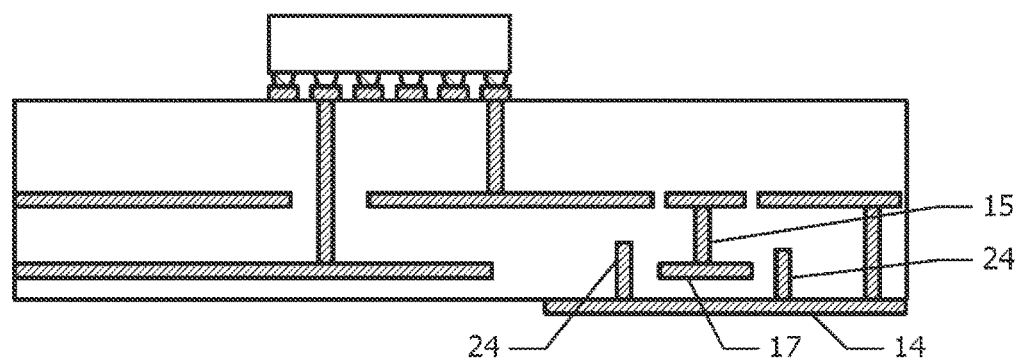
FIG. 3A is a cross section of a printed circuit board according to Embodiment 2.
Figure 3B:
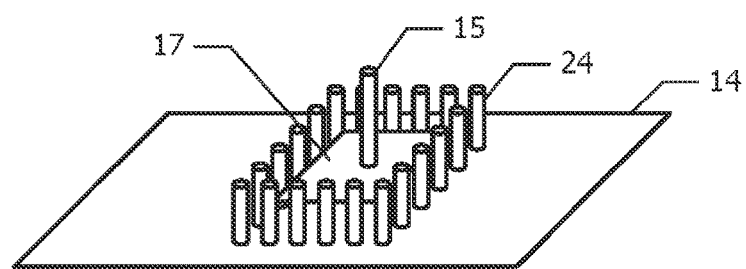
FIG. 3B is a perspective view of a radiating element and a component in a vicinity thereof.

FIG. 3A is a cross section of a printed circuit board according to Embodiment 2, and FIG. 3B is a perspective view of radiating element 17 and a component in a vicinity thereof. In Embodiment 2, a plurality of electrically conductive shielding members 24 are disposed such that they are mutually separated and that they surround radiating element 17 in plan view. Shielding member 24 is connected to shielding film 14. Mutually adjacent shielding members 24 are spaced by a distance which is sufficiently smaller than a wavelength of an electromagnetic wave radiated from radiating element 17, i.e., a wavelength corresponding to a frequency of noise to be reduced. Thus, shielding member 24 has a function to shield the electromagnetic wave.

In Embodiment 1, shielding film 14 is disposed such that it is spaced from radiating element 17 in the direction of the thickness. In Embodiment 2, in addition to shielding film 14, shielding member 24 is also disposed such that it is spaced from radiating element 17 in an in-plane direction. This can further effectively shield an electromagnetic wave radiated from radiating element 17.

Embodiment 3

Figure 4A:
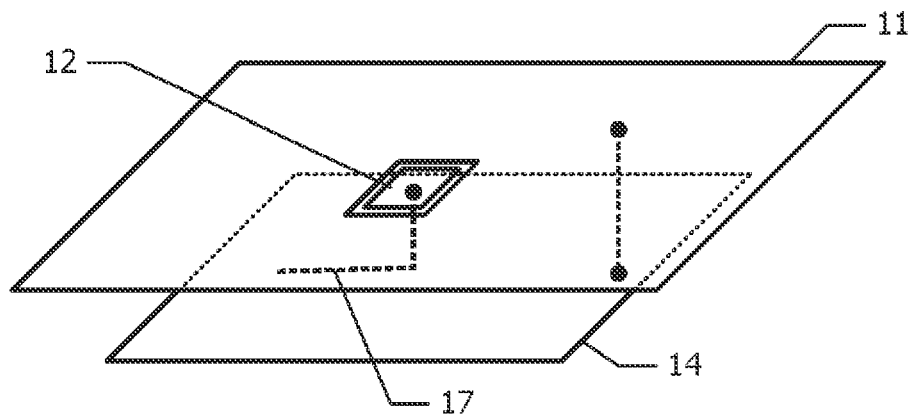
FIG. 4A is a perspective view of a ground conductor film, a floating conductor film, a radiating element, and a shielding film of a printed circuit board according to Embodiment 3.

FIG. 4A is a perspective view of ground conductor film 11, floating conductor film 12, radiating element 17, and shielding film 14 of a printed circuit board according to Embodiment 3. Hereinafter, a difference from Embodiment 1 shown in FIG. 1A to FIG. 2 will be focused on and thus described, and the identical configuration will not be described.

Figure 4B:
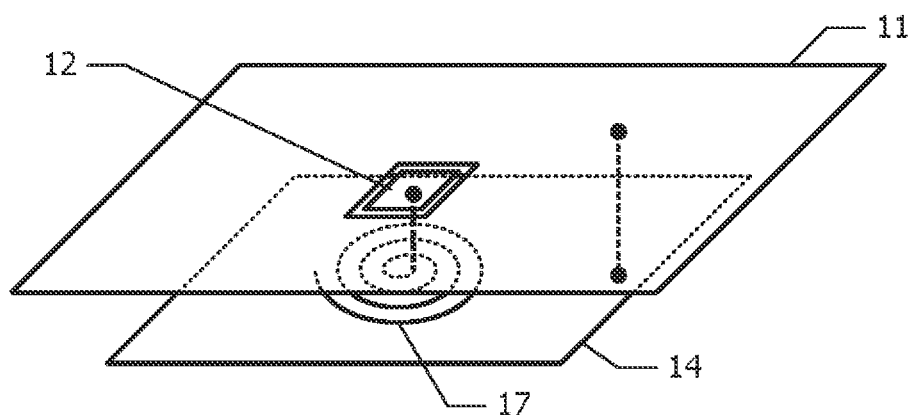
FIG. 4B is a perspective view of a ground conductor film, a floating conductor film, a radiating element, and a shielding film of a printed circuit board according to Embodiment 3 in an exemplary variation.

In Embodiment 1, as shown in FIG. 1B, a patch antenna is used as radiating element 17. In Embodiment 3, a monopole antenna is used as radiating element 17. The monopole antenna is composed of a linear pattern disposed at second conductor layer 32 (see FIG. 1A). The monopole antenna's electric length is set to be able to efficiently radiate an electromagnetic wave of a frequency band of noise to be removed. More specifically, the monopole antenna's electric length is set to approximately ¼ of a wavelength of an electromagnetic wave of a frequency band of noise to be removed. Note that, as shown in FIG. 4B, radiating element 17 may be made into a spiral.

Embodiment 3 also allows a radiating element which operates as a monopole antenna to radiate an electromagnetic wave attributed to a noise current. This can reduce a noise level in the printed circuit board.

Embodiment 4

Then, with reference to FIG. 5A and FIG. 5B, a printed circuit board according to Embodiment 4 will now be described. Hereinafter, a difference from Embodiment 1 shown in FIG. 1A to FIG. 2 will be focused on and thus described, and the identical configuration will not be described.

Figure 5A:
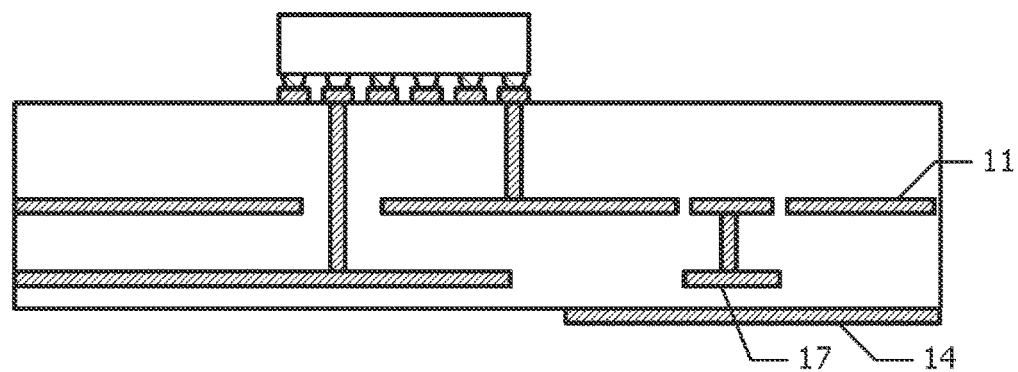
FIG. 5A is a cross section of a printed circuit board according to Embodiment 4.
Figure 5B:
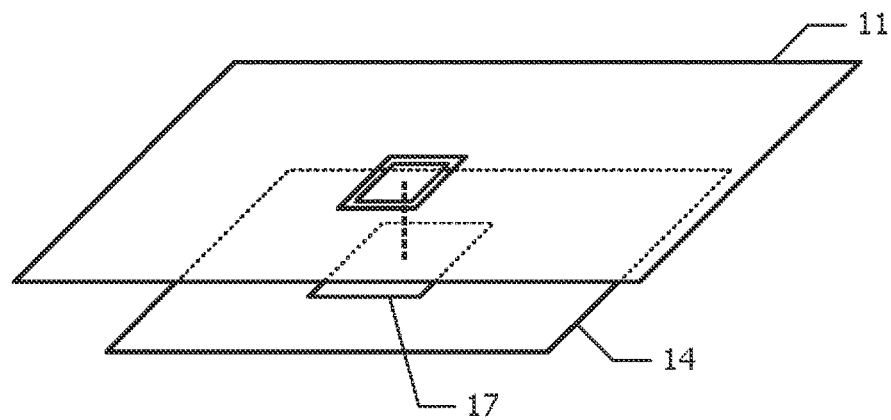
FIG. 5B is a perspective view of a radiating element and a component in a vicinity thereof.

FIG. 5A is a cross section of the printed circuit board according to Embodiment 4, and FIG. 5B is a perspective view of radiating element 17 and a component in a vicinity thereof. While Embodiment 1 provides shielding film 14 (see FIG. 1A, FIG. 1B) formed of metal, Embodiment 4 provides shielding film 14 formed of a magnetic material. Ferrite is mentioned as an example of the magnetic material. Furthermore, in Embodiment 4, shielding film 14 is not connected to ground conductor film 11. Radiating element 17 radiates an electromagnetic wave, which is absorbed by shielding film 14 of ferrite or the like.

Embodiment 4 can also reduce a noise level in the printed circuit board. Furthermore, it can suppress radiation of an electromagnetic wave to outside the printed circuit board.

While the present disclosure has thus been described along the embodiments, the present disclosure is not limited thereto. For example, it will be obvious to a skilled artisan that a variety of changes, improvements, combinations, etc. are possible.

The invention claimed is:

1. A printed circuit board comprising:
   a ground conductor film formed at an insulating substrate;
   a floating conductor film capacitively coupled to the ground conductor film;
   a radiating element connected to the floating conductor film;
   a shielding film shielding an electromagnetic wave radiated from the radiating element; and
   a plurality of pads disposed in an integrated circuit mounting area of the insulating substrate within which an integrated circuit is to be mounted, wherein
   the shielding film is formed of a conductive material and connected to the ground conductor film,
   a noise current flows from the ground conductor film to the floating conductor film,
   the floating conductor film is disposed at a same conductor layer as the ground conductor film, and
   the shielding film and the floating conductor film are disposed not to overlap with the integrated circuit mounting area in a plan view.

2. The printed circuit board according to claim 1, wherein the radiating element includes a conductor pattern disposed at a conductor layer different from the floating conductor film.

3. The printed circuit board according to claim 2, wherein the shielding film is disposed such that the shielding film is spaced from the conductor pattern in a direction of a thickness.

4. The printed circuit board according to claim 1, wherein the shielding film is formed of a magnetic material.

* * * * *